(12) United States Patent
Stephens, IV et al.

(10) Patent No.: US 8,345,720 B2
(45) Date of Patent: Jan. 1, 2013

(54) LASER DIODE CERAMIC COOLER HAVING CIRCUITRY FOR CONTROL AND FEEDBACK OF LASER DIODE PERFORMANCE

(75) Inventors: Edward F. Stephens, IV, Golden Eagle, IL (US); Courtney Ryan Feeler, St. Louis, MO (US); Jeremy Scott Junghans, St. Charles, MO (US)

(73) Assignee: Northrop Grumman Systems Corp., Los Angeles, CA (US)

( * ) Notice: Subject to any disclaimer, the term of this patent is extended or adjusted under 35 U.S.C. 154(b) by 193 days.

(21) Appl. No.: 12/841,810

(22) Filed: Jul. 22, 2010

(65) Prior Publication Data

US 2011/0026551 A1 Feb. 3, 2011

Related U.S. Application Data

(60) Provisional application No. 61/229,188, filed on Jul. 28, 2009.

(51) Int. Cl.
*H01S 5/024* (2006.01)
*H01S 5/40* (2006.01)

(52) U.S. Cl. ........... 372/35; 372/34; 372/36; 372/50.12; 372/50.122

(58) Field of Classification Search ............... 372/34–36, 372/50.12, 50.122
See application file for complete search history.

(56) References Cited

U.S. PATENT DOCUMENTS

| | | | |
|---|---|---|---|
| 3,303,432 A | 2/1967 | Garfinkel et al. | 331/94.5 |
| 3,339,151 A | 8/1967 | Smith | 331/94.5 |
| 3,590,248 A | 6/1971 | Chatterton, Jr. | 250/199 |
| 3,622,906 A | 11/1971 | Nyul | 257/88 |
| 3,654,497 A | 4/1972 | Dyment et al. | 307/312 |
| 3,683,296 A | 8/1972 | Scalise | 331/94.5 |
| 3,771,031 A | 11/1973 | Kay | 317/235 R |
| 3,802,967 A | 4/1974 | Ladany et al. | 148/171 |
| 3,890,161 A | 6/1975 | Brown, III | 136/212 |
| 3,896,473 A | 7/1975 | DiLorenzo et al. | 357/15 |
| 3,958,263 A | 5/1976 | Panish et al. | 357/18 |
| 3,962,655 A | 6/1976 | Selway et al. | 331/945 H |
| 4,053,860 A | 10/1977 | Kozacka et al. | 337/164 |

(Continued)

FOREIGN PATENT DOCUMENTS

DE 4315580 11/1994

(Continued)

OTHER PUBLICATIONS

Ahearn, W.E., "Thermal Spacer for Room Temperature Close-Packed GaAs Laser Arrays," IBM Technical Disclosure Bulleting, vol. 12, No. 12, p. 2311, May 1970.

(Continued)

*Primary Examiner* — Yuanda Zhang
*Assistant Examiner* — Michael Carter
(74) *Attorney, Agent, or Firm* — Nixon Peabody LLP

(57) ABSTRACT

A laser diode package includes a laser diode, a cooler, and control circuitry, such as an integrated circuit. The laser diode is used for converting electrical energy to optical energy. The cooler receives and routes a coolant from a cooling source via internal channels. The cooler includes a plurality of ceramic sheets. The ceramic sheets are fused together. The ceramic sheets include traces or vias that provide electrically conductive paths to the integrated circuit. The control circuitry controls the output of the laser diode, e.g. the output at each of the laser diode's emitters. Multiple laser diode packages are placed together to form an array.

15 Claims, 4 Drawing Sheets

U.S. PATENT DOCUMENTS

| | | | |
|---|---|---|---|
| 4,057,101 A | 11/1977 | Ruka et al. | 165/1 |
| 4,092,614 A | 5/1978 | Sakuma et al. | 331/945 P |
| 4,136,435 A | 1/1979 | Li | 438/22 |
| 4,219,072 A | 8/1980 | Barlow | 165/32 |
| 4,228,406 A | 10/1980 | Lewis et al. | 331/945 D |
| 4,233,567 A | 11/1980 | Chernoch | 331/945 P |
| 4,315,225 A | 2/1982 | Allen, Jr. et al. | 372/35 |
| 4,383,270 A | 5/1983 | Schelhorn | 357/71 |
| 4,393,393 A | 7/1983 | Allen, Jr. et al. | 357/81 |
| 4,415,234 A | 11/1983 | Myers | 350/310 |
| 4,454,602 A | 6/1984 | Smith | 372/36 |
| 4,573,067 A | 2/1986 | Tuckermann et al. | 357/82 |
| 4,617,585 A | 10/1986 | Yasui | 357/72 |
| 4,673,030 A | 6/1987 | Basiulis | 165/32 |
| 4,709,750 A | 12/1987 | White | 165/10 |
| 4,716,568 A | 12/1987 | Scifres et al. | 372/36 |
| 4,730,324 A | 3/1988 | Azad | 372/33 |
| 4,782,222 A | 11/1988 | Ragle et al. | 250/211 J |
| 4,831,629 A | 5/1989 | Paoli et al. | 372/50 |
| 4,837,768 A | 6/1989 | Schmid | 372/36 |
| 4,847,848 A | 7/1989 | Inoue et al. | 372/50 |
| 4,852,109 A | 7/1989 | Kuchar | 372/34 |
| 4,877,641 A | 10/1989 | Dory | 427/38 |
| 4,881,233 A | 11/1989 | von Arb et al. | 372/35 |
| 4,881,237 A | 11/1989 | Donnelly | 372/50 |
| 4,899,204 A | 2/1990 | Rosen et al. | 357/30 |
| 4,901,330 A | 2/1990 | Wolfram et al. | 372/75 |
| 4,949,346 A | 8/1990 | Kuper et al. | 372/36 |
| 4,963,741 A | 10/1990 | McMullin | 250/338 |
| 4,975,923 A | 12/1990 | Buus et al. | 372/50 |
| 5,001,355 A | 3/1991 | Rosen et al. | 250/551 |
| 5,005,640 A | 4/1991 | Lapinski et al. | 165/170 |
| 5,022,042 A | 6/1991 | Bradley | 372/75 |
| 5,031,187 A | 7/1991 | Orenstein et al. | 372/50 |
| 5,040,187 A | 8/1991 | Karpinski | 372/50 |
| 5,073,838 A | 12/1991 | Ames | 361/103 |
| 5,076,348 A | 12/1991 | Bluege | 165/902 |
| 5,084,888 A | 1/1992 | Tajima et al. | 372/39 |
| 5,099,214 A | 3/1992 | Rosen et al. | 333/157 |
| 5,099,487 A | 3/1992 | Rickey et al. | 375/35 |
| 5,099,488 A | 3/1992 | Ahrabi et al. | 372/361 |
| 5,105,429 A | 4/1992 | Mundinger et al. | 372/34 |
| 5,115,445 A | 5/1992 | Mooradian | 372/75 |
| 5,128,951 A | 7/1992 | Karpinski | 372/50 |
| 5,156,999 A | 10/1992 | Lee | 437/215 |
| 5,163,064 A | 11/1992 | Kim et al. | 372/50 |
| 5,212,699 A | 5/1993 | Masuko et al. | 372/50 |
| 5,216,263 A | 6/1993 | Paoli | 257/88 |
| 5,216,688 A | 6/1993 | Kortz et al. | 372/75 |
| 5,220,954 A | 6/1993 | Longardner et al. | 165/10 |
| 5,253,260 A | 10/1993 | Palombo | 372/34 |
| 5,265,113 A | 11/1993 | Halldörsson et al. | 372/36 |
| 5,284,790 A | 2/1994 | Karpinski | 437/129 |
| 5,287,375 A | 2/1994 | Fujimoto | 372/38 |
| 5,305,344 A | 4/1994 | Patel | 372/36 |
| 5,311,535 A | 5/1994 | Karpinski | 372/50 |
| 5,311,536 A | 5/1994 | Paoli et al. | 372/50 |
| 5,315,154 A | 5/1994 | Elwell | 257/707 |
| 5,323,411 A | 6/1994 | Shirasaka et al. | 372/43 |
| 5,325,384 A | 6/1994 | Herb et al. | 370/13 |
| 5,337,325 A | 8/1994 | Hwang | 372/36 |
| 5,351,259 A | 9/1994 | Ishimori et al. | 372/75 |
| 5,388,755 A | 2/1995 | Baxter | 228/123.1 |
| 5,394,426 A | 2/1995 | Joslin | 372/50 |
| 5,394,427 A | 2/1995 | McMinn et al. | 372/70 |
| 5,402,436 A | 3/1995 | Paoli | 372/50 |
| 5,402,437 A | 3/1995 | Mooradian | 372/92 |
| 5,438,580 A | 8/1995 | Patel et al. | 372/36 |
| 5,475,349 A | 12/1995 | Cohn | 333/218 |
| 5,485,482 A | 1/1996 | Selker et al. | 372/75 |
| 5,495,490 A | 2/1996 | Rice et al. | 372/34 |
| 5,520,244 A | 5/1996 | Mundinger et al. | 257/712 |
| 5,526,373 A | 6/1996 | Karpinski | 372/101 |
| 5,550,852 A | 8/1996 | Patel et al. | 372/33 |
| 5,663,979 A | 9/1997 | Marshall | 372/103 |
| 5,715,264 A | 2/1998 | Patel et al. | 372/36 |
| 5,734,672 A | 3/1998 | McMinn et al. | 372/50 |
| 5,745,514 A | 4/1998 | Patel et al. | 372/43 |
| 5,761,234 A | 6/1998 | Craig et al. | 372/75 |
| 5,764,675 A | 6/1998 | Juhala | 372/50 |
| 5,834,840 A | 11/1998 | Robbins et al. | 275/705 |
| 5,835,515 A | 11/1998 | Huang | 372/36 |
| 5,835,518 A | 11/1998 | Mundinger et al. | 372/50 |
| 5,898,211 A | 4/1999 | Marshall et al. | 257/601 |
| 5,903,583 A | 5/1999 | Ullman et al. | 372/35 |
| 5,913,108 A | 6/1999 | Stephens et al. | 438/109 |
| 5,985,684 A | 11/1999 | Marshall et al. | 438/26 |
| 5,987,043 A | 11/1999 | Brown et al. | 372/36 |
| 6,018,602 A | 1/2000 | Mayor et al. | 385/27 |
| 6,026,109 A | 2/2000 | Micke et al. | 372/92 |
| 6,061,378 A | 5/2000 | Marshall et al. | 372/75 |
| 6,245,307 B1 | 6/2001 | Inui et al. | 423/231.5 |
| 6,266,353 B1 | 7/2001 | Freitas et al. | 372/36 |
| 6,272,159 B1 | 8/2001 | Garcia | 372/36 |
| 6,307,871 B1 | 10/2001 | Herberle | 372/34 |
| 6,310,900 B1 | 10/2001 | Stephens et al. | 372/36 |
| 6,317,443 B1 | 11/2001 | Craig et al. | 372/38.04 |
| 6,351,478 B1 | 2/2002 | Herberle | 372/36 |
| 6,352,873 B1 | 3/2002 | Hoden | 438/28 |
| 6,356,574 B1 | 3/2002 | Craig et al. | 372/75 |
| 6,397,618 B1 | 6/2002 | Chu et al. | 622/592 |
| 6,480,514 B1 | 11/2002 | Lorenzen et al. | 372/35 |
| 6,498,385 B1 | 12/2002 | Daubenspeck et al. | 257/529 |
| 6,570,895 B2 | 5/2003 | Heberle | 622/592 |
| 6,580,150 B1 | 6/2003 | Metzler | 257/594 |
| 6,603,498 B1* | 8/2003 | Konnunaho et al. | 347/236 |
| 6,636,538 B1 | 10/2003 | Stephens | 257/675 |
| 6,728,275 B2* | 4/2004 | Stephens et al. | 372/36 |
| 6,791,181 B2 | 9/2004 | Horie et al. | 257/706 |
| 6,859,472 B2 | 2/2005 | Betin et al. | 372/35 |
| 6,919,525 B2 | 7/2005 | Pinneo | 257/675 |
| 7,190,706 B2* | 3/2007 | McColloch | 372/34 |
| 7,262,467 B2 | 8/2007 | Kelbertau | 257/355 |
| 7,680,171 B2* | 3/2010 | Yamamoto et al. | 372/50.12 |
| 2002/0018498 A1 | 2/2002 | Heberle | 372/35 |
| 2002/0170747 A1 | 11/2002 | Chu et al. | 174/256 |
| 2003/0142711 A1 | 7/2003 | Treusch et al. | 372/36 |
| 2003/0201530 A1 | 10/2003 | Kurihara et al. | 257/712 |
| 2004/0179791 A1 | 9/2004 | Robert et al. | 385/88 |
| 2004/0202216 A1* | 10/2004 | Fairgrieve | 372/38.07 |
| 2004/0247005 A1 | 12/2004 | Schrodinger et al. | 372/38.1 |
| 2005/0018726 A1* | 1/2005 | Dinger et al. | 372/38.09 |
| 2005/0051891 A1 | 3/2005 | Yoshida et al. | 257/720 |
| 2005/0094688 A1 | 5/2005 | Scofet et al. | 372/36 |
| 2006/0045154 A1 | 3/2006 | Linares | 372/36 |
| 2006/0108009 A1 | 5/2006 | Stevanovic et al. | 165/80.4 |
| 2006/0203866 A1 | 9/2006 | Stephens, IV | 372/43.01 |
| 2007/0153847 A1 | 7/2007 | Faircloth et al. | 372/35 |
| 2008/0025357 A1* | 1/2008 | Coleman et al. | 372/36 |
| 2008/0094841 A1 | 4/2008 | Dahm | 362/294 |
| 2008/0267234 A1 | 10/2008 | Scofet et al. | 372/36 |
| 2009/0262767 A1 | 10/2009 | Thiagarajan et al. | 372/34 |

FOREIGN PATENT DOCUMENTS

| | | |
|---|---|---|
| DE | 10328440 | 1/2005 |
| EP | 0 458 469 | 11/1991 |
| EP | 0 550 996 | 7/1993 |
| EP | 0 634 822 | 1/1995 |
| EP | 0 805 527 | 11/1997 |
| EP | 0 833 419 | 4/1998 |
| EP | 1 187 196 | 3/2002 |
| JP | 55-65450 | 5/1980 |
| JP | 59-103565 | 6/1984 |
| JP | 60-211992 | 10/1985 |
| JP | 01123493 A | 5/1989 |
| JP | 02281782 | 11/1990 |
| JP | 3-6875 | 1/1991 |
| JP | 03016290 A | 1/1991 |
| JP | 3-269325 | 3/1991 |
| JP | 4-359207 | 6/1991 |
| JP | 04-023381 | 1/1992 |
| JP | 04-314375 | 11/1992 |
| JP | 6-13717 | 1/1993 |
| JP | 2002-025784 | 1/2002 |
| JP | 2002-353551 A | 12/2002 |
| JP | 2004-146720 A | 5/2004 |
| JP | 2004-356429 A | 12/2004 |

| | | |
|---|---|---|
| JP | 2006-032406 A | 2/2006 |
| WO | WO 96/28846 | 9/1996 |
| WO | WO 00/59086 | 10/2000 |
| WO | WO 03/075423 | 9/2003 |
| WO | WO 2004/062051 | 7/2004 |
| WO | WO 2006/006455 A1 | 1/2006 |

OTHER PUBLICATIONS

Thomson CSF Semiconducteurs Specifiques, Package Specification (schematic), p. 3 (one page). Date unknown.

IBM Corp. "Heat Sink Assembly for Tab-Mounted Devices," IBM Technical Disclosure Bulletin, vol. 31, No. 6, pp. 372-373, Nov. 1988 (2 pages).

IBM Corp. "Circuit Module Cooling With Multiple Pistons Contacting a Heat Spreader/Electrical Buffer Plate in Contact With Chip," IBM Technical Disclosure Bulletin, vol. 31, No. 12, pp. 5-7, May 1989 (2 pages).

Mundinger, D. High Average Power Edge Emitting Laser Diode Arrays on Silicon Microchannel Coolers, Nov. 19, 1990 (3 pages).

Endriz, John G. "High Power Diode Laser Arrays," IEEE Journal of Quantum Electronics, No. 4, pp. 952-965, Apr. 1992 (14 pages).

Coherent Laser Group, Laser Diodes and Bars (article) (5 pages). Date unknown.

Article, "Analysis of Substrates for Single Emitter Laser Diodes," Tapani M. Alander et al., Institute of Electronics, Sep. 2003, vol. 125, pp. 313-318 (6 pages).

Advancing Microelectronics Catalog, vol. 32, No. 3, May/Jun. 2005 (40 pages).

Peter Z. Shi, K.M. Chua, Stephen C.K. Wong, & Y.M. Tan, *Design and Performance Optimization of Miniature Heat Pipes in LTCC*, Journal of Physics: Conference Series Institute of Physics Publishing, Bristol, GB, vol. 34, No. 1, 142-147 (Apr. 1, 2006) (6 pages).

PCT International Search Report for International Application No. PCT/US2007/016517 mailed on Dec. 4, 2008 (4 pages).

PCT International Written Opinion for International Application No. PCT/US2007/016517 mailed on Dec. 4, 2008 (7 pages).

B. Welber, *Heat Sink for High Powered Injection Lasers*, IBM Technical Disclosure Bulletin, (Sep. 1965) (2 pages).

Sergey K. Gordeev et al., *SiC-Skeleton Cemented Diamond A Novel Engineering Material With Unique Properties*, Ceramic Engineering and Science Proceedings, vol. 21, No. 3, 753-760 (2000) (8 pages).

Dirk Lorenzen et al., *Micro Thermal Management of High-Power Diode Laser Bars*, IEEE Transactions on industrial Electronics, vol. 48, No. 2 (Apr. 2001) (12 pages).

Michael Leers et al., *Expansion-Matched Passively Cooled Heatsinks With Low Thermal Resistance for High Power Diode Laser Bars*, Proceedings of the SPIE, vol. 6104, 20-29 (Feb. 2006) (10 pages).

PCT International Search Report for International Application No. PCT/US2007/016740 mailed on Feb. 1, 2008 (5 pages).

V. Glaw, R. Hahn, A. Paredes, U. Hein, O. Ehrmann, H. Reichl; 1997 International Symposium on Advanced Packaging Materials, Laser Machining of Ceramics Silicon for MCM-D Applications,(1997) (4pages).

\* cited by examiner

LASER DIODE CERAMIC COOLER HAVING CIRCUITRY FOR CONTROL AND FEEDBACK OF LASER DIODE PERFORMANCE

CROSS-REFERENCE TO RELATED APPLICATIONS

This application claims the benefit of U.S. Provisional Application No. 61/229,188, filed Jul. 28, 2009, which is hereby incorporated by reference herein in its entirety.

FIELD OF THE INVENTION

The present invention relates generally to laser diodes and, in particular, to a ceramic cooler that includes circuitry for controlling the performance of the laser diode and/or providing feedback of some characteristic of the laser diode or its performance.

BACKGROUND OF THE INVENTION

Semiconductor laser diodes have numerous advantages. One advantage is the small size of the laser diodes. For example, an active region of a laser diode has a width that is typically a submicron to a few microns, a height that is usually no more than a fraction of a millimeter, and a length that is typically less than about a millimeter. Internal reflective surfaces, which produce emission in one direction, are formed by cleaving the substrate from which the laser diodes are produced and, thus, have high mechanical stability.

High efficiencies are possible with semiconductor laser diodes with some having external quantum efficiencies near 70%. Semiconductor laser diodes produce radiation at wavelengths from about 20 to about 0.7 microns depending on the semiconductor alloy that is used. For example, laser diodes manufactured from gallium arsenide with aluminum doping ("AlGaAs") emit radiation at approximately 0.8 microns (~800 nm), which is near the absorption spectrum of common solid state laser rods and slabs manufactured from Neodymium-doped, Yttrium-Aluminum Garnet ("Nd:YAG"), and other crystals and glasses. Thus, semiconductor laser diodes can be used as an optical pumping source for larger, solid state laser systems.

Universal utilization of semiconductor laser diodes has been restricted by thermally related problems. These problems are associated with the large heat dissipation per unit area of the laser diodes that results in elevated junction temperatures and stresses induced by thermal cycling. Laser diode efficiency and the service life of the laser diode are decreased as the operating temperature in the junction increases.

Furthermore, the emitted wavelength of a laser diode is a function of its junction temperature. Thus, when a specific output wavelength is desired, maintaining a constant junction temperature is essential. For example, AlGaAs laser diodes that are used to pump an Nd:YAG rod or slab should emit radiation at about 808 nm because this is the wavelength at which optimum energy absorption exists in the Nd:YAG. However, for every 3.5° C. to 4.0° C. deviation in the junction temperature of the AlGaAs laser diode, the wavelength shifts 1 nm. Accordingly, controlling the junction temperature and, thus, properly dissipating the heat is critical.

When solid state laser rods or slabs are pumped by laser diodes, dissipation of the heat becomes more problematic because it becomes necessary to densely pack a plurality of individual diodes into arrays that generate the required amounts of input power for the larger, solid state laser rod or slab. However, when the packing density of the individual laser diodes is increased, the space available for extraction of heat from the individual laser diodes decreases. This aggravates the problem of heat extraction from the arrays of individual diodes.

One type of a cooling system for a laser diode package utilizes microchannel coolers made from metals, such as copper. These laser diode packages are small, e.g., 1 mm thick, and have small water channels running though them. The water channels pass close to a bottom side of the heat source (i.e., the laser diode bar), allowing for efficient thermal transfer. Because typical microchannel coolers are made from copper, electrical current and water coolant reside in the same physical space. Consequently, the coolant water must be deionized. However, the use of deionized water requires all the parts that are exposed to the water-supply to be glass, plastic, stainless steel, or gold-plated. Parts that are not made of these materials usually deteriorate quickly due to erosion and corrosion problems. Accordingly, one problem associated with current microchannel coolers is that they require a complicated and expensive deionized water system.

Additional problems relate to the failure of certain emitters of the laser diode. Often, a failure of one emitter can trigger the failure of the entire laser diode. Furthermore, certain characteristics (e.g., temperature) of the laser diode can cause different operating performances of the laser diode. Because laser diodes are small devices and must be packaged small to provide high outputs per unit area, it is difficult to provide additional devices to help protect against failures or for sensing certain characteristics.

Thus, a need exists for a microchannel cooling system for a laser diode that provides enhanced cooling while providing the ability to make electrical contact with several control or sensing devices.

SUMMARY OF THE INVENTION

According to one aspect of the present invention, a laser diode package includes a laser diode, a cooler, and an integrated circuit. The laser diode is used for converting electrical energy to optical energy. The cooler receives and routes a coolant from a cooling source via internal channels, preferably including impingement flow. The cooler includes a plurality of ceramic sheets that are fused together. The ceramic sheets include electrical traces or vias that are coupled to the integrated circuit. The integrated circuit controls the output and/or performance of the laser diode.

In another aspect of the invention, a laser diode array comprises a plurality of laser diode packages including a first laser diode package and a second laser diode package. Each of the laser diode packages includes a laser diode, integrated circuitry, and a cooler. The laser diode converts electrical energy to optical energy at a plurality of emitters. The integrated circuitry selectively controls the output from each of the emitters of the laser diode. A cooler is comprised of a plurality of ceramic sheets that are fused together. The cooler includes internal channels for routing the coolant. The plurality of ceramic layers include an exposed upper sheet having a plurality of traces that lead from the integrated circuitry to the emitters of the laser diode allowing the integrated circuit to selectively control the output from each of the emitters of the laser diode. The cooler for the first laser diode package includes a metallization layer to receive electrical current from the laser diode of the second laser diode package and to pass the electrical current to the integrated circuitry for that first laser diode package for use in the laser diode of the first laser diode package.

In yet another aspect of the invention, a laser diode package comprises a laser diode, a cooler, and control circuitry. The laser diode converts electrical energy to optical energy at a plurality of emitters. The cooler receives a coolant from a cooling source. The cooler is comprised of a plurality of ceramic sheets that are fused together. The cooler includes internal channels for routing the coolant. One or more of the ceramic layers include a plurality of individual electrically conductive paths. The laser diode is mounted on the cooler and is electrically coupled to the electrically conductive paths. The control circuitry is mounted on the cooler and is electrically coupled to the plurality of electrically conductive paths to control the performance of the laser diode. The control circuitry controls the amount of electrical energy that is supplied to portions of the laser diode.

In a further aspect of the invention, a laser diode package comprises a laser diode, a cooler, and control circuitry. The laser diode converts electrical energy to optical energy at a plurality of emitters. The cooler receives a coolant from a cooling source. The cooler comprises a plurality of ceramic sheets and an exposed sheet. The ceramic sheets are fused together and the exposed sheet is attached to a top ceramic sheet of the plurality of ceramic sheets. The plurality of ceramic sheets have apertures for defining internal channels for routing the coolant. At least the exposed sheet includes individual electrical traces. The laser diode is mounted on the cooler and the traces are electrically coupled to a corresponding one of the emitters of the laser diode. The control circuitry is mounted on the cooler and is electrically coupled to the traces to control the electrical power supplied to each emitter by the corresponding trace.

The above summary of the present invention is not intended to represent each embodiment or every aspect of the present invention. The detailed description and Figures will describe many of the embodiments and aspects of the present invention.

BRIEF DESCRIPTION OF THE DRAWINGS

The foregoing and other advantages of the invention will become apparent upon reading the following detailed description and upon reference to the drawings.

Figure 1:
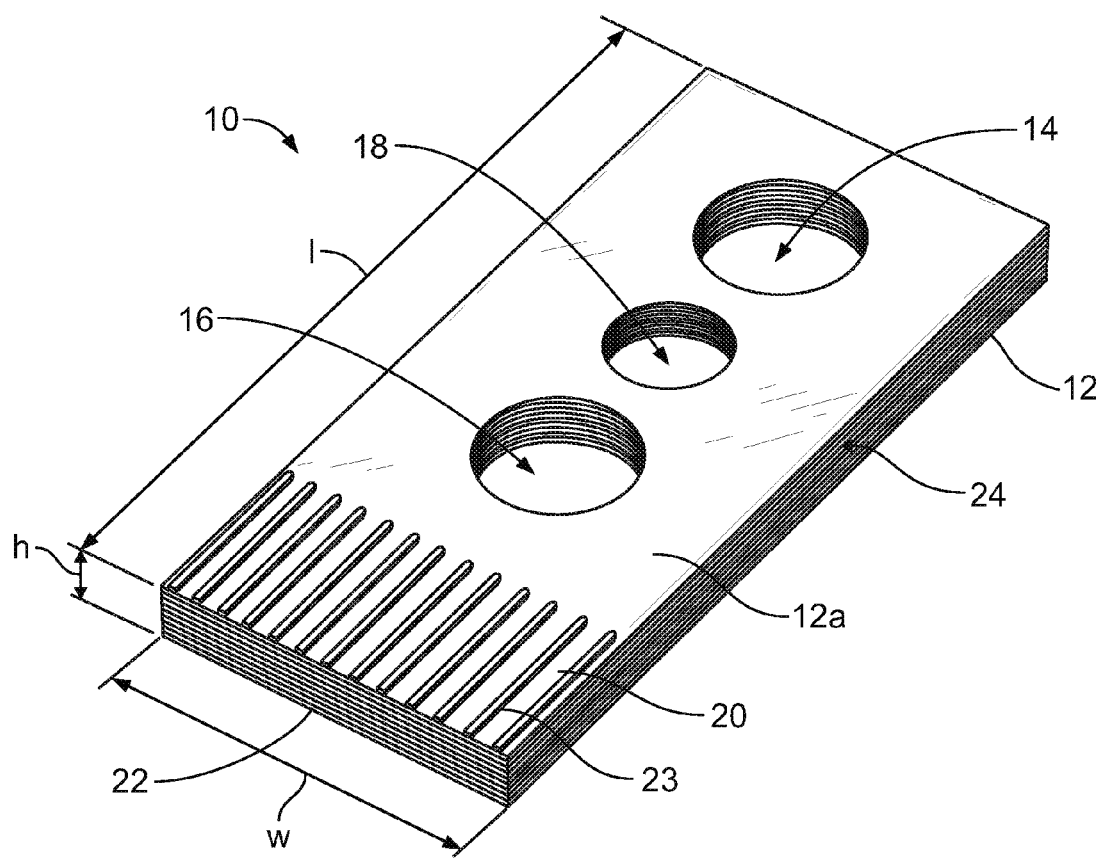
FIG. 1 illustrates a perspective view of a ceramic microchannel cooler for a laser diode, according to an embodiment of the present invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

Referring to FIG. 1, a microchannel cooler 10 includes a plurality of sheets 12, each sheet 12 having an outlet hole 14, an inlet hole 16, and an alignment hole 18. The inlet hole 16 and the outlet hole 14 have generally the same diameter and shape, and are used, respectively, to receive a coolant fluid from and return the coolant fluid to a cooling source. The alignment hole 18 is centrally located between and has a smaller diameter than the outlet hole 14 and the inlet hole 16. The alignment hole 18 is used to align the microchannel cooler 10 when stacked with other microchannel coolers 10, as discussed below with respect to FIG. 4. A guide pin is inserted through corresponding alignment holes 18 of the individual laser diode packages. The pairs of O-rings (see FIG. 4) are inserted into respective ones of the outlet holes 14 and inlets holes 16 to provide a leak-free passage for the coolant fluid. According to one embodiment, the microchannel cooler 10 has a height (h) of 0.072 inches (1.829 millimeters), a width (w) of 0.460 inches (11.684 millimeters), and a length (l) of 1.038 inches (26.365 millimeters).

Figure 2:
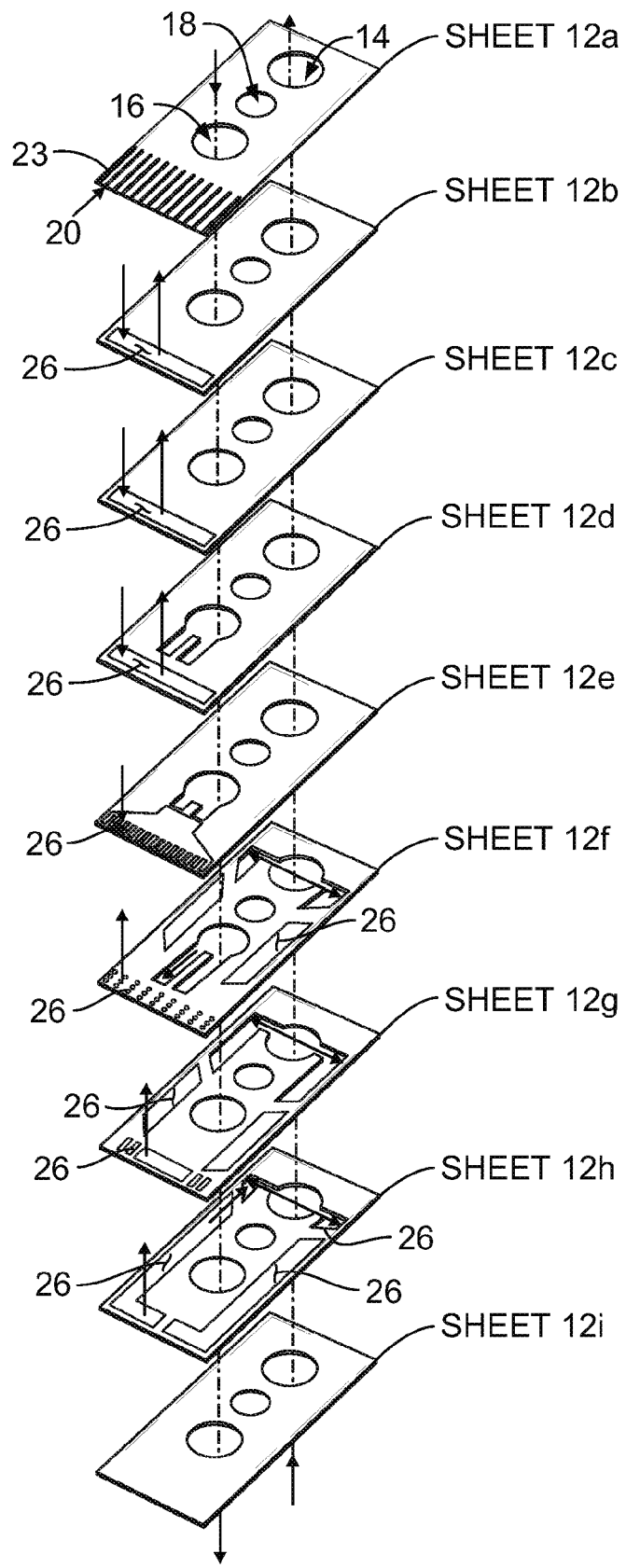
FIG. 2 illustrates an exploded view of the microchannel cooler illustrated in FIG. 1.

Referring to FIG. 2, the plurality of sheets 12 includes nine sheets 12a-12i. The sheets 12a-12i are preferably low-temperature cofired ceramic ("LTCC") sheets. When made of LTCC, the sheets 12 are bonded together in multiple layers by a thermal process that causes the glass molecules within the ceramic of each layer to bond together. Because the sheets 12 of the microchannel cooler 10 are electrically non-conductive, the microchannel cooler 10 provides thermal communication and electrical isolation between the laser diode bar and the coolant fluid.

Each of the sheets 12a-12i is processed to produce distinct internal channels (such as by punching or laser etching) so that coolant channels are formed between the respective inlet hole 16 and outlet hole 14 to allow the coolant fluid to pass through the microchannel cooler 10. Instead of being made as LTCC, the first (or top or exposed) sheet 12a can have a higher thermal conductivity (e.g., diamond sheet) than the remaining eight lower sheets.

In one example, the sheets 12a-12i are manufactured using a "DuPont 951AX" LTCC material with a thickness of about ten mils (0.01 inches). Alternatively, the lower sheets 12a-12i can be made using a high-temperature cofired ceramic material ("HTCC"). Alternatively yet, some of the plurality of sheets 12 can be made from a material selected from LTCC, HTCC, diamond, silicon carbide (SiC), aluminum nitride (AlN), cubic boron nitride (cBN), pyrex, silicon, sapphire, PEEK™ (Polyetheretherketone), beryllium oxide (BeO), glass, and other similar materials. The sheet material is selected based on its low electrical conductivity characteristic, which is needed to prevent the mixing of the coolant and the electrical current.

The top sheet 12a includes a laser diode area 20, which is located on a top surface of the top sheet 12a and is generally a narrow strip. The laser diode area 20 is near a front side 22 (shown in FIG. 1) of the microchannel cooler 10. In one example, the laser diode area 20 is approximately 0.120 inches (3.048 millimeters). Metallic traces 23 are applied to the top sheet 12a in the laser diode area 20 to create electrically conductive surfaces for conducting electrical current to individual emitters in the laser diode (shown in FIG. 3) that is mounted on the laser diode area 20. The metallic traces 23 are typically produced by lithography (or other common means) and are made of a solderable metal (e.g., gold), for attaching the laser diode bar. Alternatively, the metallic traces 23 can be made using any electrically conductive material and/or their respective alloys, including gold, nickel, titanium, platinum, etc. The front corner between the laser diode area 20 and the front side 22 of the microchannel cooler 10 is typically made "square" with less than twenty-five micrometers, and, preferably, less than five micrometers of rounding. The traces 23 are typically in the range of 200 to 500 microns in width, and have a thickness of less than about 100 microns in thickness, and preferably about 50 microns in thickness.

A number of the lower sheets 12b-12i include one or more multi-directional apertures 26 in addition to the outlet hole 14, the inlet hole 16, and the alignment hole 18. For example, the sheet 12h adjacent to the bottom sheet 12i includes a plurality of L-shaped apertures 26 near the front and lateral sides of the sheet 12h, and a plurality of lateral apertures 26 connected to the outlet hole 14. In addition to the coolant fluid flowing in a direction parallel to the axis of the outlet hole 14, the multi-directional apertures 26 are used to distribute the flow of the coolant fluid in at least one other direction that is perpendicular to the axis of the outlet hole 14. Specifically, the multi-directional apertures 26 distribute the coolant fluid beneath the laser diode area 20 for a more efficient removal of heat produced by the laser diode bar. The outlet 14 and inlet 16 have dimensions of about 3 mm to about 4 mm. The dimensions of larger ones of the apertures 26 are in range of about 1 to about 2 mm. The smaller perforations and apertures 26 in the sheets 12e and 12f, which are used for creating enhanced flow (e.g., turbulent flow) toward the backside of the diode area 20 of the top sheet 12a, have dimensions that are in the range of a few hundred microns. These smaller perforations (less than 200 microns, e.g., approximately circular perforations that are about 125 microns in diameter or even about 25 microns in diameter) act like individual jets spraying a fluid stream to the back side of the laser diode area 20. Thus, the primary mode of cooling is due to the impingement flow of fluid on the back side of the laser diode area 20. The flow then reverses direction after impinging upon the surface. Arrows are shown to indicate the general direction of flow of the coolant fluid. Although FIG. 2 illustrates one type of internal channel system in the microchannel cooler 10, other types of channels and paths can be used. Further details of a ceramic microchannel cooler 10 are disclosed in U.S. Pat. No. 7,656,915, which is commonly owned and incorporated by reference in its entirety.

The electrically non-conductive sheets 12a-12i eliminate the need for using a typical complicated deionized water system. For example, the microchannel cooler 10 can use a simple distilled water system or any other conductive coolant, as well as nonconductive fluids such as Fluoroinert® from the 3M Corporation.

Figure 3:
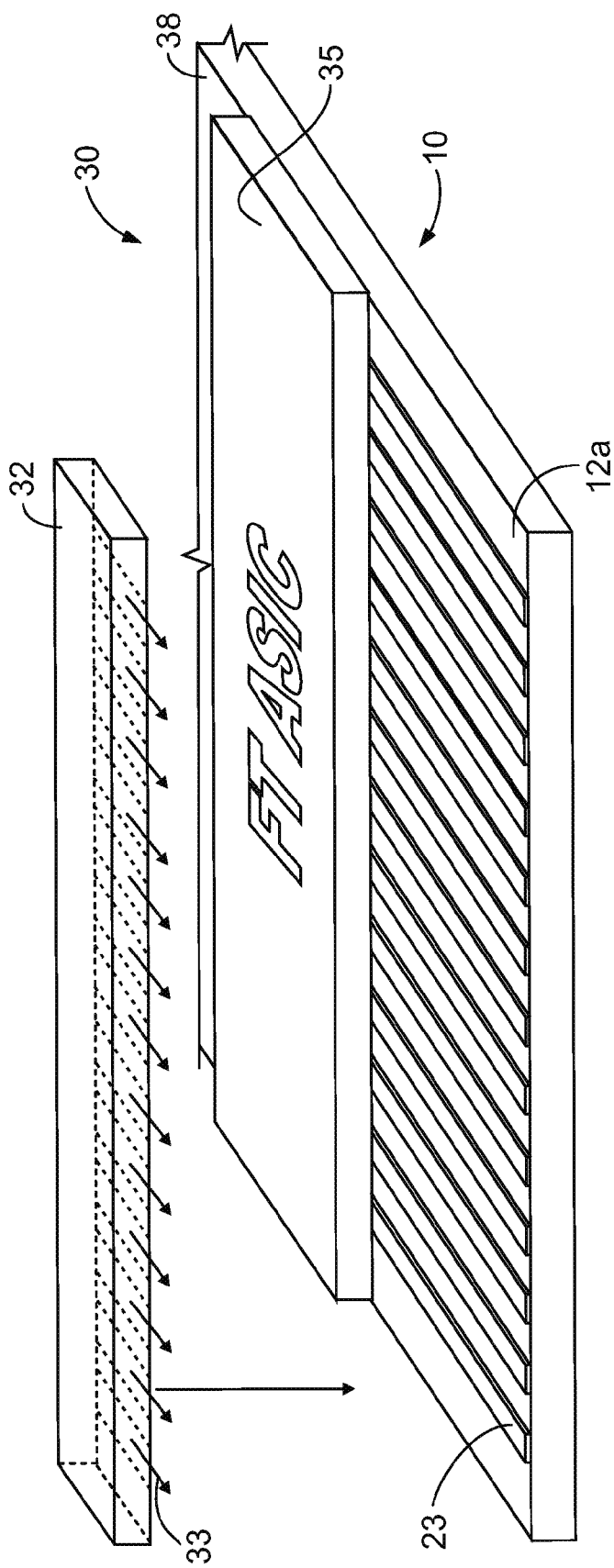
FIG. 3 illustrates a perspective view of a laser diode package that includes a laser diode, an integrated circuit, and the microchannel cooler of FIGS. 1-2.

FIG. 3 illustrates a schematic of a laser diode package 30 that includes the microchannel cooler 10 (only top layer 12a is shown) and a laser diode 32. The laser diode 32 includes a plurality of emitters 33 for producing coherent energy. The laser diode package 30 further includes a device 35 (e.g. an ASIC) that allows for the control and/or monitoring of the laser diode 32. As shown, the device 35 is an ASIC that has connectors on its bottom side for making electrical connection with the individual traces 23 on the top sheet 12a of the microchannel cooler 10. The ASIC provides the ability to integrate multiple "smart" functionalities into the laser diode package. When using the ASIC in the package 30, the laser diode arrays (see FIG. 4) may have the following characteristics: (i) excellent heat extraction, (ii) tightly packaged arrays with high power densities, (i.e. tight pitches), (iii) immunity from catastrophic failure and can continue to operate in the event of single or multiple emitter, or even total bar failure (as described in more detail below), (iv) capability of being easily adapted to coherently phased laser diode arrays using sub-emitter current-control regions, and (v) providing sensing for certain characteristic of the laser diode 32.

While the device 35 is shown as an ASIC, the device could simply be other types of control circuitry mounted on the top layer 12a as well. In other words, the control circuitry for the cooler 10 could include various known discrete electrical components for monitoring and/or controlling the power supplied to each of the emitters 33 via the traces 23.

To electrically connect adjacent packages 30, a wrap-around metallization layer 38 provides a current path to the bottom side of the ASIC device 35 along the top sheet 12a. The wrap-around metallization layer 38 would extend to the underside of the bottom sheet 12i, such that current leaving the laser diode 32 of the adjacent package 30 would be conducted through the metallization layer 38 to the ASIC device 35. The ASIC device 35 then controls the manner in which the current is provided to each of the emitters 33.

In one preferred embodiment, the ASIC device 35 is providing a fault-tolerance functionality to minimize a catastrophic failure of the laser diode 32 and, perhaps the overall array. In a laser diode 32 in which the emitters 33 are physically connected, operate electrically in parallel, and are spaced by only a few tens of microns, it has been heretofore difficult to develop microscopic circuitry that can monitor and control the current through each emitter on the bar. Thus, if the ASIC device 35 detects the current is outside of a predetermined range that is indicative of normal operation, it may inhibit further flow of current to that emitter 33. Without the ability to monitor and control the current through each emitter, the failure of a single emitter 33 can cause the entire laser diode 32 to catastrophically fail. Since, in large laser systems, many laser diodes 32 are often operated in series, a system level catastrophic failure can be caused by the failure of a single laser diode emitter 33 on a single laser diode bar 32. Thus, an entire laser system can fail due to the failure of a single emitter 33 on a laser diode 32 that may have a flaw that is only a few microns in size. It is important to point out that the larger the laser system, the more single emitters 33 (due to increased number of bars) the higher the probability of failure. U.S. Pat. No. 6,728,275, which is commonly owned and hereby incorporated by reference in its entirety, describes various modes of failure of a laser diode.

The cooler 10 of the present invention, by use of the unique electrical traces 23 and control/monitoring circuitry of the ASIC 35, create a self-contained, "smart" laser diode package 30 within the same form factor as traditional coolers. The creation of a smart microchannel cooler with integrated fault tolerance is made possible due to the use of the ceramic layers 12 within the package. This "smart" package 30 leads to a laser diode 32 that has the inherent robustness of groups of single emitters (used in fiber lasers) but with the compactness of standard microchannel cooled laser diode arrays. The "smart" package circuitry within the ASIC 35 includes the ability to monitor and control all electrical aspects of each individual emitter 33 and prevent any failed emitter(s) 33 from destroying the functionality of the entire laser diode package 30. This circuitry within the ASIC 35 includes current-limiting circuitry that causes the current to be inhibited form passing through the trace 23 if the current falls outside of a certain "normal" range, which indicates that the emitter 33 has begun to fail or has already failed.

It should be noted that the various layers 12 of the cooler 10 can have embedded traces for various functions. For example, embedded traces may provide an operating temperature of the laser diode 32 at one or more locations across the length of the bar. The ASIC may also be coupled to an optical sensing device outside the package 30 to determine the characteristics of the energy (e.g., energy level or wavelength) for providing feedback. Each layer 12 may have an embedded trace that allows the ASIC 35 to switch all current away from the entire laser diode 32 so that it receives no electrical power, but current is still conducted between the adjacent packages so as to keep their laser diodes 32 in operation.

In summary, due to the ceramic layers 12 in the cooler 10 and their inherent electrical isolation properties, the electrical traces 23 or other electrical vias and other control circuitry can be integrated directly into the various layers 12a-12i of the cooler 10 outside the internal cooler regions in direct contact with the cooling fluid (often water). This trait of layered ceramics, coupled with the use of one or more cooler-mounted ASIC device 35, enables the development of a fully integrated "smart" ceramic microchannel cooler capable of monitoring and controlling each individual emitter on a laser diode 32, (thirteen emitters 33 shown in the laser diode 32 as shown in FIG. 3, which correspond to the thirteen traces 23 on the top sheet 12a) Thus, the system offers the high heat extraction capability of copper coolers, the erosion and corrosion resistance of ceramic coolers, and the fault tolerance of the individual emitter configuration while still maintaining the compactness of tightly-pitched microchannel cooled arrays. In addition, with minimal additional circuitry added to these coolers or functionalities to the ASIC device 35, certain emitters 33 on the laser diode 32 could be used as phase control regions, thus, enabling high powered coherently phased laser diode arrays.

The cooler 10 may include ceramic layers 12 that are embedded with vias, traces, and sensors (e.g. bi-metallic temperature sensors) that provide various functionalities. The bi-metallic temperature sensors may be incorporated within the various layers 12 or, preferably, metals such as nickel, chromium, and platinum may be placed on the exposed layer after the firing of the ceramics occurs. If an LTCC material is used for the layers 12, then it may be possible to place two different metals (e.g. nickel, chromium, and platinum) on opposing layers 12 within the cooler 10 with traces and vias leading back to the device 35. If an HTCC material is used for the layers 12, then refractory metals such as tungsten and rhenium may be used, due to the high sintering temperatures. Temperature monitoring may be helpful in controlling the wavelength of the output energy, which is a function of the temperature of the laser diode 32. Temperature monitoring can also indicate when the laser diode 32 has begun to fail.

Additionally, there may be phase control regions adjacent to the emitters 33 within the laser diode 32. Accordingly, the phase control region may also be controlled by the device 35 through a separate trace that is coupled to the phase control region. In other words, the present invention contemplates that each emitter 33 may have more than one trace 23 associated with it for controlling the output from that emitter. When a phase control region is used for controlling the phase of the output from an emitter 33, the secondary trace would be receiving a current in the range of 100 milliamps or less, while the primary trace 23 would be receiving 1 to 10 amps for producing the necessary output from the emitter 33. In addition, the ceramic layers 12 within the cooler 10 may incorporate paths for transmitting optical energy such that the laser diode package acts as an optical amplifier. In that situation, cooler 10 acts to both cool the laser diode 32 and transmit optical energy to be used in conjunction with the laser diode 32 for optical amplification functions.

Figure 4:
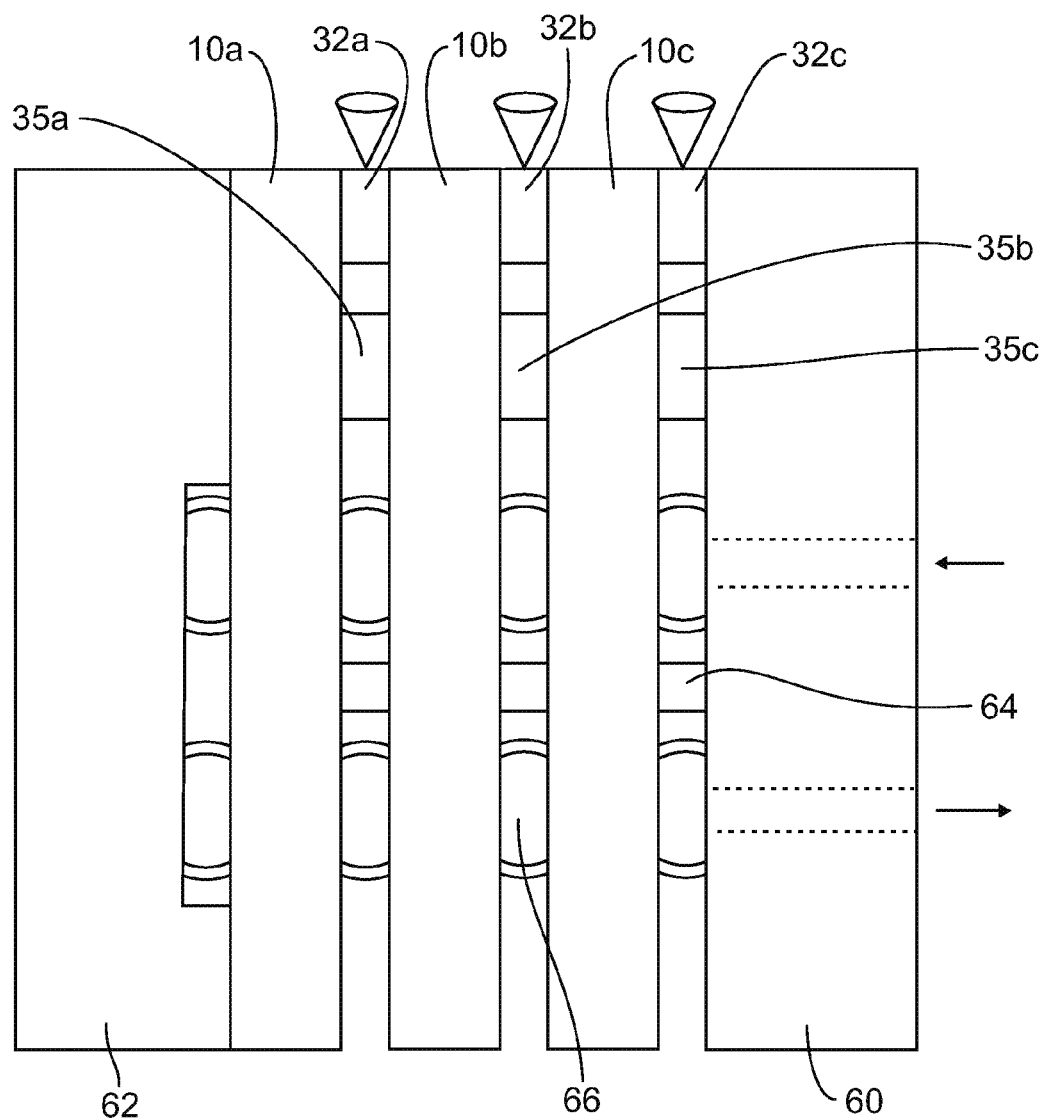
FIG. 4 illustrates an array of laser diode packages as shown in FIG. 3.

FIG. 4 illustrates three packages 30 that are placed together to form an array of laser diodes (e.g., a grouping of two or more laser diode packages). Each of the laser diodes 32 is emitting energy in response to the current supplied by the respective ASIC devices 35 through the plurality of traces 23 on the surface of the cooler (or perhaps on a ceramic layer 12 below the exterior surface of the cooler). The array would typically include two end caps 60 and 62 for "sandwiching" the packages together. The right end cap 60 would include a fluid inlet and outlet that is in communication with the inlets 16 and outlets 14 in each of the packages 30. The left end cap 62 would block the inlet fluid path, forcing the coolant to pass through the internal channels and impingement-fluid jets within each cooler 10a, 10b, 10c and eventually to the outlets 14 of each cooler 10a, 10b, 10c. The packages would be aligned by use of a guide pin 64 that would extend through the alignments holes 18 of each cooler 10. The guide pin 64 could be a screw fitted between the end caps 60 and 62 or an integral protruding piece of one of the end caps 60 and 62. O-rings 66 can be used to seal the regions between the inlets 16 and the outlets 14 of adjacent packages 30.

As shown in the embodiment of FIG. 4, when multiple packages 30 are arranged into an array, the coolant fluid is passed from a coolant source to each of the laser diode packages 30 via the respective inlet hole 16 and is returned to the coolant source from the respective outlet holes 14. Thus, the inlets 16 of the laser diode packages 30 form a top manifold and the outlets 14 form a bottom manifold, such that the fluid is evenly distributed in "parallel" fluid paths through the internal channel systems (formed by the apertures 26 shown in FIG. 2) of each of the laser diode packages 30. Of course, many other ceramic cooler configurations and flow paths can be envisioned as well.

For passing the electrical power to each of the packages, current is passed from a metallization layer on the ceramic cooler 10a to the ASIC device 35a through an input contact pad on the cooler 10a coupled to the ASIC device 35a. The ASIC device 35a then selectively distributes that input current to the emitters 33 of the laser diode 32a. Thus, if faults are detected by the ASIC device 35a in one or more emitters 33, less than all of the emitters 33 of the laser diode 32a may receive a portion of the input current. After the current passes through the individual emitters of the laser diode 32a (producing optical energy), the current is then received by a metallization layer on the surface(s) of the adjacent cooler 10b, and that metallization layer on the cooler 10b then connects with the input contact pad for the ASIC device 35b. The ASIC device 35b then performs a selective current distribution function for the emitters 33 on the laser diode 32b. Similarly, the current then leaves the laser diode 32b and travels through a metallization layer on cooler 10c to the ASIC device 35c, which selectively distributes that current to the emitters 33 on the laser diode 32c.

It should also be noted that the ASIC devices 35 can have an output in electrical communication with the adjacent cooler 10. Thus, if a massive failure in the laser diode 32a is detected by the ASIC device 35a, all of the current can then be bypassed from the failed laser diode 32a and directly passed by the ASIC 35a to the cooler 10b of adjacent package 30 so that the downstream laser diodes 32b and 32c can continue to operate.

Further, while the ASICs 35 are shown as being the same thickness as the laser diode 32, the ASIC 35 (or the other discrete control circuitry) can have smaller dimensions as well. In that case, an additional spacer component may be needed to help alleviate stress on the laser diode 32. Or, the ASIC 35 (or the other discrete control circuitry) may have larger dimensions than the laser diode 32.

Accordingly, because the electrical path is electrically isolated from the coolant fluid path, the laser diode packages 30 can use, for example, non-deionized water as a coolant fluid. Thus, the laser diode packages 30 eliminate the need to use deionized water and provide a high cooling capacity by using an electrically non-conductive material (e.g., LTCC and diamond) to route the coolant fluid. In contrast to standard copper (coefficient of thermal expansion (CTE) about $16\times10^{-6}$/per °C.) microchannel coolers, the laser diode packages 30 of the present invention also reduce stress on the respective laser diode bars 32 in operations. This is due to the fact that the ceramic sheets 12b-12i of LTCC (CTE about $6\times10^{-6}$/per °C.) and a top sheet 12a comprised of diamond (CTE about $1.5\times10^{-6}$/per °C.) or BeO (CTE about $8\times10^{-6}$/per °C.) have coefficients of thermal expansion that are closer to the gallium arsenide of the laser diode bar (CTE about $6\times10^{-6}$/per °C.) than microchannel coolers comprised of copper.

While the present invention has been described with LTCC and HTCC, the microchannel coolers can be comprised of glass materials, such as low-temperature glasses. As used herein, "ceramic" should be understood to mean the inclusion of these glasses. It is also possible to uses BeO or diamond for all of the sheets 12a-12i with surfaces (e.g., perhaps with gold applied) allowing those sheets to bond together, such as through diffusion bonding.

The cooler 10 may also have input and output traces and vias in its layers 12 leading from the ASIC 35 to external contact pads on the surface of the cooler 10 that permit the ASIC 35 to be in communication with external devices as well. This external communication with devices outside of the laser diode array may provide further control loops (e.g., control based on an external optical sensor) for the system. For example, the internal-cooler temperature sensing described above can be passed to an external device that controls the coolant temperature and flow rate of the coolant being supplied to the cooler 10. Or, external communication may permit altering the functionality or performance of the ASIC.

While the present invention has been described with reference to one or more particular embodiments, those skilled in the art will recognize that many changes may be made thereto without departing from the spirit and scope of the present invention. For example, the microchannel cooler 10 can use a "serial" cooling path instead of the "parallel" flow path, e.g., the laser diode array 40 uses a single path in which the coolant sequentially flows through each laser diode package 30. Each of these embodiments and obvious variations thereof is contemplated as falling within the spirit and scope of the claimed invention, which is set forth in the following claims.

What is claimed is:

1. A laser diode array having at least a first laser diode package and a second laser diode package, each of first and second laser diode packages comprising:
   a laser diode for converting electrical energy to optical energy at a plurality of emitters;
   a cooler for receiving a coolant from a cooling source, the cooler comprises a plurality of ceramic sheets and an exposed sheet, the ceramic sheets being fused together and the exposed sheet being attached to a top ceramic sheet of the plurality of ceramic sheets, the plurality of ceramic sheets having apertures for defining internal channels for routing the coolant, at least the exposed sheet including individual electrical traces, the laser diode being mounted on the cooler and each of the traces being in contact with the laser diode to provide power to a corresponding one of the emitters of the laser diode; and
   an integrated circuit mounted on the exposed sheet of the cooler, the plurality of traces leading from the integrated circuit to the plurality of emitters, the integrated circuit being electrically coupled to the traces to control the electrical power supplied to each emitter by the corresponding trace; and
   wherein the integrated circuit on the first laser diode package has a thickness that is substantially the same as the laser diode on the first laser diode package such that the second laser diode package is positioned against both the integrated circuit and the laser diode of the first laser diode package.

2. The laser diode array of claim 1, wherein the exposed sheet has a coefficient of thermal conductivity greater than the plurality of ceramic sheets.

3. The laser diode array of claim 1, wherein the ceramic sheets are made of a material selected from the group consisting of low temperature cofired ceramics and high temperature cofired ceramics.

4. The laser diode array of claim 1, wherein the integrated circuit is an ASIC.

5. The laser diode array of claim 1, wherein the ceramic sheets include at least one sensor.

6. The laser diode array of claim 5, wherein the at least one sensor is a bi-metallic temperature sensor.

7. The laser diode array of claim 1, wherein one of the ceramic sheets includes a plurality of perforations of less than 200 microns in dimension to create jet-impingement flow regions.

8. The laser diode array of claim 7, wherein the exposed sheet includes a diode-mounting region for receiving the laser diode, the jet-impingement flow regions impinging on the diode-mounting region of the exposed sheet.

9. A laser diode array having at least a first laser diode package and a second laser diode package, each of first and second laser diode packages comprising:
   a laser diode for converting electrical energy to optical energy at a plurality of emitters;
   a cooler for receiving a coolant from a cooling source, the cooler comprised of a plurality of ceramic sheets that are fused together, the cooler including internal channels for routing the coolant, one or more of the ceramic sheets including a plurality of individual electrically conductive traces that are attached to ceramic material of the ceramic sheets, the laser diode being mounted on the cooler and contacting the electrically conductive traces; and
   an ASIC mounted on one or more of the plurality of ceramic sheets of the cooler and being electrically coupled to the plurality of electrically conductive traces to control the performance of the laser diode, the plurality of traces leading from the ASIC to the plurality of emitters of the laser diode, the ASIC controlling the amount of electrical energy that is supplied to portions of the laser diode, and
   wherein the first laser diode package includes a metallization layer on an external surface of the cooler, the metallization layer receiving current from the second laser diode package and transmitting the current to an input pad associated with the ASIC of the first laser diode package.

10. The laser diode array of claim 9, wherein one of the ceramic sheets includes a plurality of perforations of less than 200 microns in dimension to create jet-impingement flow regions, the jet-impingement flow regions impinging on a diode-mounting region of the cooler at which the laser diode is mounted.

11. The laser diode package of claim 9, wherein the ASIC can selectively inhibit flow of current to an emitter of the plurality of emitters on the laser diode in response to the current to the emitter being outside of a predetermined range.

12. A laser diode array comprising a plurality of laser diode packages including a first laser diode package and a second laser diode package, each of the laser diode packages including:
- a laser diode for converting electrical energy to optical energy at a plurality of emitters,
- an integrated circuit for selectively controlling the output from each of the emitters of the laser diode, and
- a cooler comprised of a plurality of ceramic sheets that are fused together, the cooler including internal channels for routing the coolant, the plurality of ceramic layers including an exposed upper sheet having a plurality of traces that lead from the integrated circuit to the emitters of the laser diode allowing the integrated circuit to selectively control the output from each of the emitters of the laser diode, the laser diode being mounted on the cooler such that the laser diode is in electrical contact with the plurality of traces; and wherein the cooler for the first laser diode package includes a metallization layer to receive electrical current from the laser diode of the second laser diode package and to pass the electrical current to the integrated circuit associated with the first laser diode package for use in the laser diode of the first laser diode package.

13. The laser diode array of claim 12, wherein the integrated circuit of the second laser diode package bypasses current from the laser diode of the second laser diode package and passes the current to the first laser diode package in response to sensing a failure condition in the laser diode of the second laser diode package.

14. The laser diode array of claim 12, wherein each of the integrated circuits monitor the current flowing to each emitter of the associated laser diode via the corresponding trace.

15. The laser diode array of claim 14, wherein each of the integrated circuits can selectively inhibit flow of current to an emitter in response to the current to the emitter being outside of a predetermined range.

* * * * *